US012751140B2

(12) United States Patent
Wei et al.

(10) Patent No.: US 12,751,140 B2
(45) Date of Patent: Sep. 29, 2026

(54) DISPLAY SUBSTRATE, DISPLAY MODULE AND DISPLAY DEVICE

(71) Applicants: Yunnan Invensight Optoelectronics Technology Co., Ltd., Kunming (CN); BOE Technology Group Co., Ltd., Beijing (CN)

(72) Inventors: Junbo Wei, Beijing (CN); Shengji Yang, Beijing (CN); Pengcheng Lu, Beijing (CN); Kuanta Huang, Beijing (CN); Junyan Yang, Beijing (CN); Yuanlan Tian, Beijing (CN)

(73) Assignees: Yunnan Invensight Optoelectronics Technology Co., Ltd., Kunming (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/697,993

(22) PCT Filed: Jul. 31, 2023

(86) PCT No.: PCT/CN2023/110093
§ 371 (c)(1),
(2) Date: Apr. 2, 2024

(87) PCT Pub. No.: WO2024/066716
PCT Pub. Date: Apr. 4, 2024

(65) Prior Publication Data

US 2025/0241127 A1 Jul. 24, 2025

(30) Foreign Application Priority Data

Sep. 28, 2022 (CN) ......................... 202211189269.X

(51) Int. Cl.
*H10K 59/121* (2023.01)
*H10D 86/40* (2025.01)
*H10K 59/131* (2023.01)

(52) U.S. Cl.
CPC ....... *H10K 59/1213* (2023.02); *H10D 86/421* (2025.01); *H10K 59/131* (2023.02)

(58) Field of Classification Search
CPC ............. H10K 59/1213; H10K 59/131; H10D 86/421; G09G 3/3225
See application file for complete search history.

(56) References Cited

U.S. PATENT DOCUMENTS 12,611,670 B2 * 4/2026 Ruggeri ............ B01L 3/502761
2015/0243646 A1 * 8/2015 Kakubari ............ H10D 89/921
257/133
(Continued)

FOREIGN PATENT DOCUMENTS

CN 102624222 A 8/2012
CN 104867922 A 8/2015
(Continued)

OTHER PUBLICATIONS

CN202211189269.X first office action dated Apr. 1, 2024.

*Primary Examiner* — Laura M Menz
(74) *Attorney, Agent, or Firm* — IPro, PLLC

(57) ABSTRACT

Provided is a display substrate. The display substrate includes a silicon-based substrate and pixel units arranged on the silicon-based substrate; the silicon-based substrate includes a first trap and a second trap arranged in a first direction; a first deep trap is included between the silicon-based substrate and the second trap; the first deep trap surrounds the second trap; the silicon-based substrate is provided with a first conductive layer; the first conductive layer includes a first source of the first thin film transistor and a first adapter electrode; the first source is connected to
(Continued)

a source contact region of the first active layer through a first connecting via hole; the first adapter electrode is connected to a second trap contact region of the second trap through a second connecting via hole; and the first source is electrically connected to the first adapter electrode.

20 Claims, 5 Drawing Sheets

(56) References Cited

U.S. PATENT DOCUMENTS

| | | | | |
|---|---|---|---|---|
| 2018/0151654 | A1* | 5/2018 | Lee | H10D 86/423 |
| 2024/0224594 | A1* | 7/2024 | Moon | H10K 59/1213 |
| 2024/0373674 | A1* | 11/2024 | Liu | H10K 59/1213 |
| 2025/0241127 | A1* | 7/2025 | Wei | H10D 86/421 |

FOREIGN PATENT DOCUMENTS

| | | | | | |
|---|---|---|---|---|---|
| CN | 108877655 | A | | 11/2018 | |
| CN | 108932929 | A | | 12/2018 | |
| CN | 109389940 | A | | 2/2019 | |
| CN | 110728946 | A | | 1/2020 | |
| CN | 111756366 | A | * | 10/2020 | H03K 19/0185 |
| CN | 113450712 | A | * | 9/2021 | G09G 3/3208 |
| CN | 115173856 | A | * | 10/2022 | H03L 7/08 |
| CN | 115377176 | A | * | 11/2022 | H10D 86/421 |
| CN | 115763487 | A | * | 3/2023 | H10K 59/35 |
| CN | 113450712 | B | * | 4/2023 | G09G 3/3208 |
| CN | 116322154 | A | * | 6/2023 | H10K 59/122 |
| CN | 111756366 | B | * | 3/2024 | H03K 19/0185 |
| CN | 114127836 | B | * | 3/2024 | H10D 86/60 |
| CN | 113066841 | B | * | 5/2024 | H10D 86/471 |
| CN | 118281008 | A | * | 7/2024 | H10D 30/6757 |
| CN | 115377176 | B | * | 9/2025 | H10D 86/421 |
| EP | 4145512 | A1 | * | 3/2023 | H10K 59/35 |
| KR | 102344964 | B1 | * | 12/2021 | H10K 59/131 |
| KR | 102798317 | B1 | * | 4/2025 | H10K 59/1216 |
| WO | WO-2022000339 | A1 | * | 1/2022 | H10D 86/60 |
| WO | WO-2024000219 | A1 | * | 1/2024 | H10K 59/1216 |
| WO | WO-2024066716 | A1 | * | 4/2024 | H10D 86/421 |

* cited by examiner

DISPLAY SUBSTRATE, DISPLAY MODULE AND DISPLAY DEVICE

CROSS-REFERENCE TO RELATED APPLICATION

This application is a U.S. national stage of international application No. PCT/CN2023/110093, filed on Jul. 31, 2023, which claims priority to Chinese Patent Application No. 202211189269.X, filed on Sep. 28, 2022 and entitled "DISPLAY SUBSTRATE, DISPLAY MODULE AND DISPLAY DEVICE", the contents of which are herein incorporated by reference in their entireties.

TECHNICAL FIELD

The present disclosure belongs to the field of display technologies, and in particular relates to a display substrate, a display module and a display device.

BACKGROUND

With the development of organic light-emitting diodes (OLEDs), the OLEDs have the advantages of self-luminescence, wide viewing angle, almost infinitely high contrast, low power consumption, extremely high response speed and the like, and thus are more and more used in various display devices.

SUMMARY

Some embodiments of the present disclosure provide a display substrate, including a silicon-based substrate and a plurality of pixel units arranged on the silicon-based substrate, wherein each pixel unit includes a pixel drive circuit and a light-emitting component;

- the pixel drive circuit includes a first thin film transistor, a second thin film transistor and a third thin film transistor arranged on the silicon-based substrate, wherein the first thin film transistor includes a first source, a first drain, a first gate and a first active layer, the second thin film transistor includes a second active layer, and the third thin film transistor includes a third active layer;
- the silicon-based substrate is provided with a first trap and a second trap arranged in a first direction, a first deep trap is further included provided the silicon-based substrate and the second trap, and the first deep trap is arranged around the second trap;
- the second trap is provided with the first active layer, and the first trap is provided with the second active layer and the third active layer; and
- the silicon-based substrate is also provided with a first conductive layer, the first conductive layer includes first source and a first adapter electrode, the first source is connected to a source contact region of the first active layer through a first connecting via hole, the first adapter electrode is connected to a second trap contact region of the second trap through a second connecting via hole, and the first source is electrically connected to the first adapter electrode.

In some embodiments, the third active layer and the second active layer are provided in the same first trap.

In some embodiments, the silicon-based substrate is provided with two first traps and one second trap in the first direction, the third active layer and the second active layer are provided in the different first traps, the second trap surrounds the first trap where the third active layer is provided, and the first deep trap surrounds the second trap.

In some embodiments, the display substrate further includes a plurality of repeating units arranged on the silicon-based substrate in an array, wherein

- each repeating unit includes two pixel units arranged side by side in the first direction;
- the repeating unit is provided with two second traps arranged on the silicon-based substrate in the first direction and one first trap sandwiched between the two second traps, a first deep trap is arranged between the second trap and the silicon-based substrate, and the first deep trap is arranged around one of the second traps; and
- in the first direction, the two second active layers are sandwiched between the two third active layers in the first trap.

In some embodiments, the repeating units arranged in a second direction share the first trap.

In some embodiments, the display substrate further includes a plurality of repeating units arrayed on the silicon-based substrate in an array, wherein

- the repeating unit includes two pixel units arranged side by side in the first direction;
- the repeating unit is provided with two second traps arranged on the silicon-based substrate in the first direction and three first traps sandwiched between the two second traps;
- the third active layer is disposed in the first trap near the second trap, and in the first trap in the middle, two second active layers are arranged in the first direction;
- the second trap surrounds the first trap where the third active layer is provided, and the first deep trap is arranged around one of the second traps; and
- in the first direction, one of the first traps is sandwiched between the two first deep traps.

In some embodiments, the repeating units arranged in a second direction share the first trap disposed in the middle.

In some embodiments, the first conductive layer further includes a first drain, wherein the first drain is electrically connected to a drain contact region of the first active layer through a third connecting via hole; and

- first drains of the adjacent first thin film transistors are electrically connected at the first conductive layer.

In some embodiments, the first conductive layer further includes a first conductive pattern, wherein the first conductive pattern at least partially includes a first power signal line, and the first drain is electrically connected to the first conductive pattern.

In some embodiments, the display substrate further includes a third conductive layer distal from a side of the first conductive layer, wherein the third thin film transistor includes a third drain; the third drain is arranged on the third conductive layer; the third drain is electrically connected to a drain contact region of the third active layer through a fourth connecting via hole; the light-emitting component includes a first electrode, a light-emitting layer and a second electrode; and the first electrode is electrically connected to the third drain.

In some embodiments, the display substrate further includes:

- a second conductive layer disposed between the silicon-based substrate and the first conductive layer and including the first gate, a second gate of the second thin film transistor and a third gate of the third thin film transistor;

a first gate insulating layer disposed between the silicon-based substrate and the second conductive layer;

a first interlayer insulating layer disposed between the first conductive layer and the second conductive layer; and a second interlayer insulating layer disposed on a side of the first conductive layer distal from the silicon-based substrate; wherein the first connecting via hole, the second connecting via hole and the third connecting via hole run through the first interlayer insulating layer and the first gate insulating layer, and the fourth connecting via hole runs through the second interlayer insulating layer, the first interlayer insulating layer and the first gate insulating layer.

In some embodiments, the display substrate further includes a first encapsulation layer, a color film layer and a second encapsulation layer sequentially arranged distal from the second electrode of the light-emitting component.

Some embodiments of the present disclosure further provide a display module, including any one of the display substrates described above.

The display module further includes a flexible printed circuit board and cover glass.

Some embodiments of the present disclosure further provide a display device, including any one of the display modules described above.

DETAILED DESCRIPTION

In order to make those skilled in the art better understand the technical solutions of the present disclosure, the present disclosure will be further described in detail with reference to the accompanying drawings and specific embodiments.

Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. Similarly, the term "a", "an", "the" or the like is not intended to limit the number, but to denote the number of at least one. The term "comprise" or "include", or the like is intended to mean that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect. The terms "upper", "lower", "left", "right" and the like are only used to indicate the relative positional relationship, and when the absolute position of a described object changes, the relative positional relationship may also change accordingly.

Figure 1:
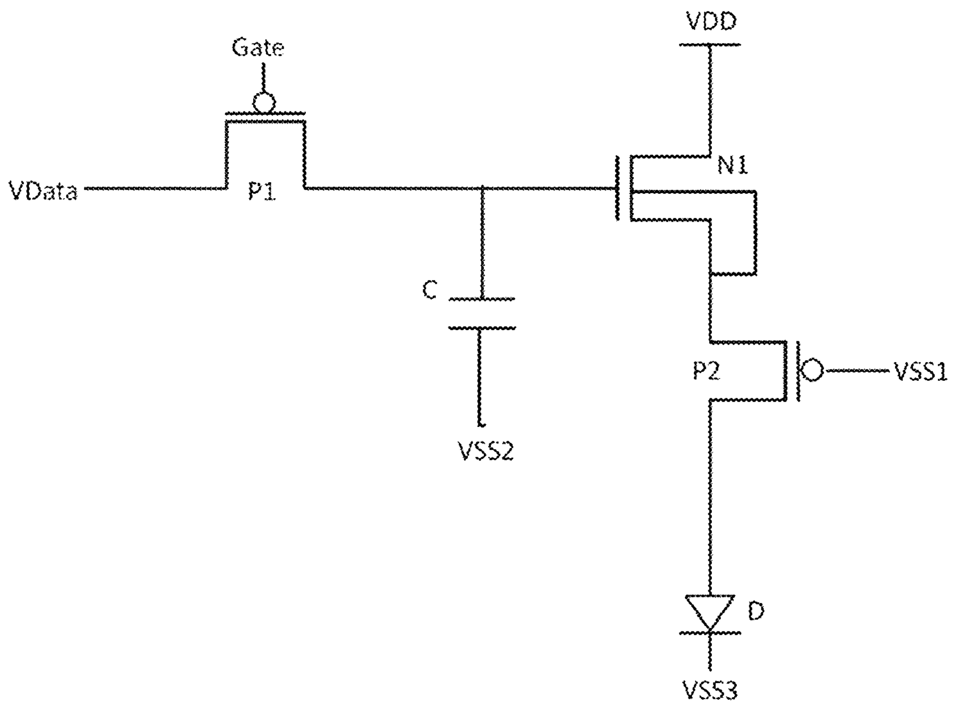
FIG. 1 is a circuit diagram according to some embodiments of the present disclosure.

FIG. 1 is a circuit diagram according to some embodiments of the present disclosure. As shown in FIG. 1, in the embodiments of the present disclosure, a pixel drive circuit includes a first thin film transistor N1, a second thin film transistor P1, a third thin film transistor P2, a storage capacitor C and a light-emitting component D. The first thin film transistor N1 includes a first source N11, a first drain N12 and a first gate N13. The second thin film transistor P1 includes a second source, a second drain and a second gate. The third thin film transistor P2 includes a third source, a third drain P22 and a third gate P23. The storage capacitor C includes a first plate and a second plate. The light-emitting component D includes a first electrode.

It should be noted that the transistors used in the embodiment of the present disclosure are thin film transistors, field effect transistors, or identical devices with the same characteristics. Since the source and the drain of the transistor used are symmetrical, there is no difference between the source and the drain. In addition, the transistors are divided into N-type transistors and P-type transistors according to the characteristics. In use of the P-type transistor, the source and the drain are electrically connected when a low-level signal is input by the gate. In use of the N-type transistor, the source and the drain are electrically connected when a high-level signal is input by the gate. In the embodiments of the present disclosure and the following descriptions, an explanation is made by taking that in a pixel circuit, the first thin film transistor N1 is an N-type transistor and the second thin film transistor P1 and the third thin film transistor P2 are P-type transistors as an example. However, the transistors are not limited to an N-type transistor for the first thin film transistor N1, and P-type transistors for the second thin film transistor P1 and the third thin film transistor P2 in the embodiments of the present disclosure, and those skilled in the art can also make adjustments according to actual needs, for example, by using a P-type thin film transistor as the first thin film transistor N1, N-type transistors as the second thin film transistor P1 and the third thin film transistor P2, and other different solutions to achieve the functions of one or more transistors in the embodiments of the present disclosure.

As shown in FIG. 1, the first thin film transistor N1 is used as a driving transistor in the circuit, the second thin film transistor P1 is used as a data writing transistor in the circuit, and the third thin film transistor P2 is used as a light-emitting controlling transistor in the circuit. A connection point of the first gate N13 of the first thin film transistor N1, the second drain of the second thin film transistor P1 and the first plate of the storage capacitor C is a first node. A first drain N12 of the first thin film transistor N1 is connected to a first supply voltage signal terminal VDD. A second source of the second thin film transistor P1 is connected to a data signal terminal VData, and a second gate thereof is connected to a scanning signal terminal Gate. A third gate P23 of the third thin film transistor P2 is connected to a first reference voltage signal terminal VSS1, and a third drain P22 thereof is connected to the first electrode of the light-emitting component D. The second plate of the storage capacitor C is connected to a second reference voltage signal terminal VSS2. The second electrode of the light-emitting component D is connected to a third reference voltage signal terminal VSS3.

Figure 2:
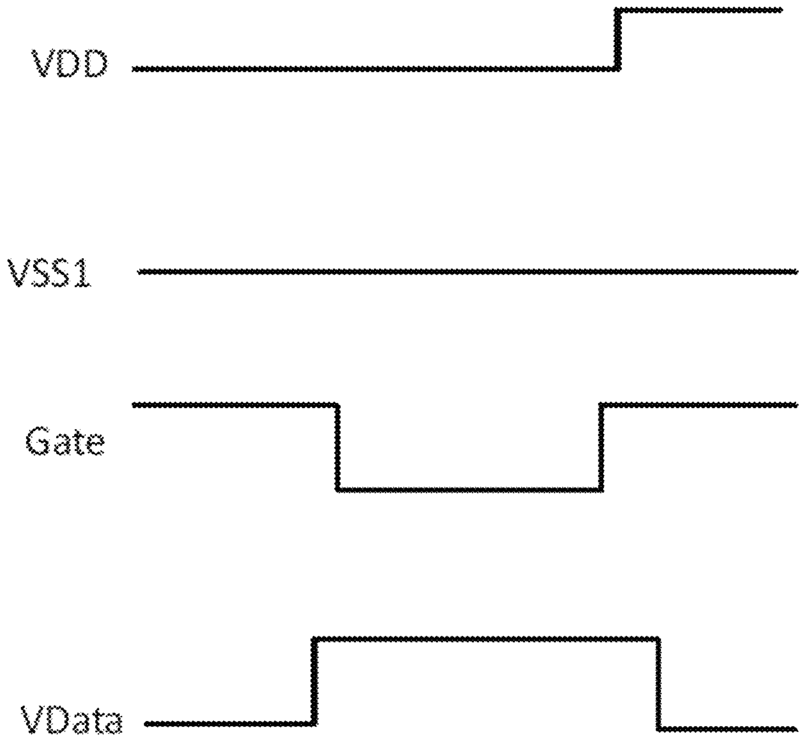
FIG. 2 is a driving timing diagram of a pixel circuit shown in FIG. 1.

FIG. 2 is a driving timing diagram of the pixel circuit shown in FIG. 1. As shown in FIG. 2, the working process of the pixel circuit is described as follows: a data signal is input by the data signal terminal VData, a low-level signal is input by the scanning signal terminal Gate, the second thin film transistor P1 is turned on under the control of the low-level signal to transmit a data signal to the storage capacitor C, and the storage capacitor C stores the data signal. The first thin film transistor N1 is turned on under the control of the data signal stored in the storage capacitor C, so that the gate and the drain of the first thin film transistor N1 are connected. The third gate P23 of the third thin film transistor P2 is connected to the first reference voltage signal terminal VSS1, and the first reference voltage signal terminal VSS1 is a reference ground. Therefore, a gate voltage of the third thin film transistor P2 is kept at a low level, and the third thin film transistor P2 is always in an on state. At this time, the first thin film transistor N1 converts a voltage of a first supply voltage signal into driving current, so that the light-emitting component D between the first supply voltage terminal and the third reference voltage signal terminal VSS3 forms a current loop, which drives the light-emitting component D to emit light. A voltage loaded to the first electrode of the light-emitting component D is a voltage input by the data signal terminal VData minus a threshold voltage of the first thin film transistor N1.

Further, a latch-up effect is triggered in the case that the first electrode and the second electrode of the OLED device are short-circuited in light emission, leading to a failure or damage of the circuit. In the case that the first electrode and the second electrode of the OLED device are short-circuited, a parasitic PN junction at the drain of the third thin-film transistor P2 is reverse-biased, which in turn prevents the latch-up effect. Therefore, according to the embodiments of the present disclosure, the design of the pixel drive circuit can prevent an entire display region from being defective due to an anode-cathode short circuit of the OLED device in an individual pixel unit 1.

In the embodiments of the present disclosure, the first source N11 of the first thin film transistor N1 is connected to a bulk where the first active layer of the first thin film transistor N1 is disposed, so as to eliminate a bias effect. Experimental tests show that the threshold voltage of the first thin film transistor N1 is increased to about 2.8 V before the first source N11 is connected to the bulk, and a maximum voltage loaded onto the first electrode of the light-emitting component D is about 5.2 V (8 V-2.8 V) when a data signal voltage is 8 V; and by connecting the first source N11 to the bulk, the bias effect is eliminated, so that the threshold voltage of the first thin film transistor N1 is reduced to about 1.1 V, and the maximum voltage loaded onto the first electrode of the light-emitting component D is about 6.9 V (8 V-1.1 V) when the data signal voltage is 8 V. Therefore, by connecting the first source N11 to the bulk, the bias effect is eliminated and the maximum voltage that is loaded onto the first electrode of the light-emitting component D is increased. Since the maximum voltage that is loaded onto the first electrode is increased, the voltage span range of the first electrode is expanded, and the voltage that is loaded onto the first electrode is within the range of 0.58 V to 6.9 V. The display contrast is improved by expanding the range of voltage that is loaded onto the first electrode.

With the development of organic light-emitting diodes (OLEDs), the OLEDs have the advantages of self-luminescence, wide viewing angle, almost infinitely high contrast, low power consumption, extremely high response speed and the like, and thus are more and more used in various display devices. Owing to the market demand and more and more application scenarios, the demands on OLED devices are increasing, in which a wider brightness range and a higher PPI have become the main requirements. How to extend the span range of the voltage provided for the anode of the OLED device by the pixel drive circuit to realize high-brightness display and large-brightness-range display, and how to reduce the area of the pixel unit 1 and improve the PPI have become urgent problems to be solved.

The bias effect mainly comes from the impact of the bias voltage between the bulk and the source of the thin film transistor on the threshold voltage of the thin film transistor: taking an NMOS as an example, when the potential of the source of the transistor is higher than the potential of the bulk, more holes in a surface layer below the gate are attracted to the bulk, so that immovable negative ions left in a depletion layer are increased, the width of a depletion layer is increased, and the volume charge surface density Qdep in the depletion layer is also increased, which in turn leads to an increase of the threshold voltage of the thin film transistor and causes the maximum value of a driving voltage provided for the first electrode of the light-emitting component D by the pixel drive circuit to decrease.

In view of this, the present disclosure provides a display substrate. The source and the bulk of the first thin film transistor N1 for driving are connected and kept at the same potential when the display substrate is manufactured. By this method, the bias effect is eliminated, the threshold voltage of the thin film transistor is prevented from rising, and voltage loss of a data signal of the pixel drive circuit is reduced, which in turn increases the maximum voltage provided for the anode of the light-emitting component D by the pixel drive circuit, increases the span of the voltage loaded on the anode, improves the maximum brightness of the light-emitting component D and expands the range of brightness.

The present disclosure provides a display substrate, a display module and a display device, which have high brightness, high contrast and high PPI.

The display substrate provided by the embodiments of the present disclosure will be described below with reference to the accompanying drawings and specific embodiments.

Figure 3:
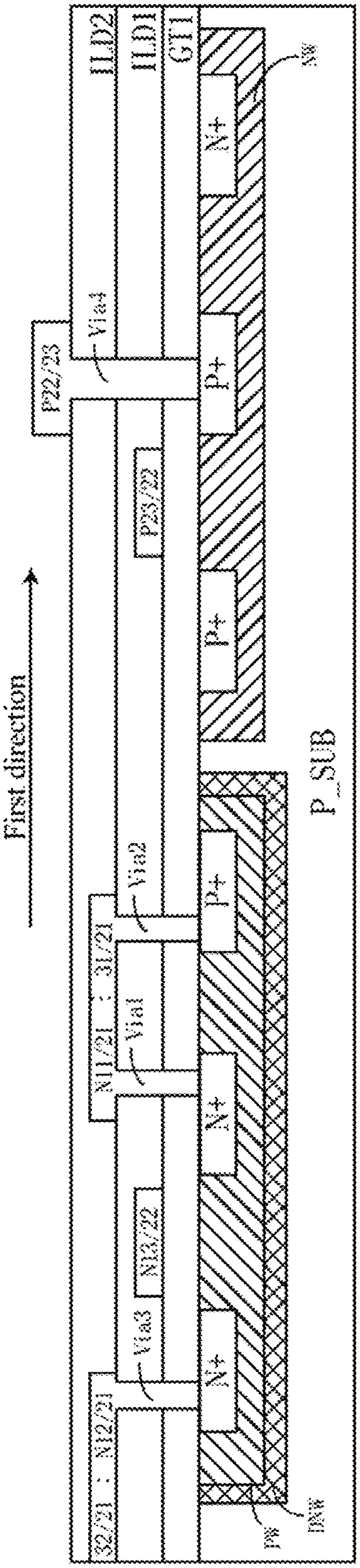
FIG. 3 is a schematic sectional diagram of a display substrate according to some embodiments of the present disclosure.
Figure 4:
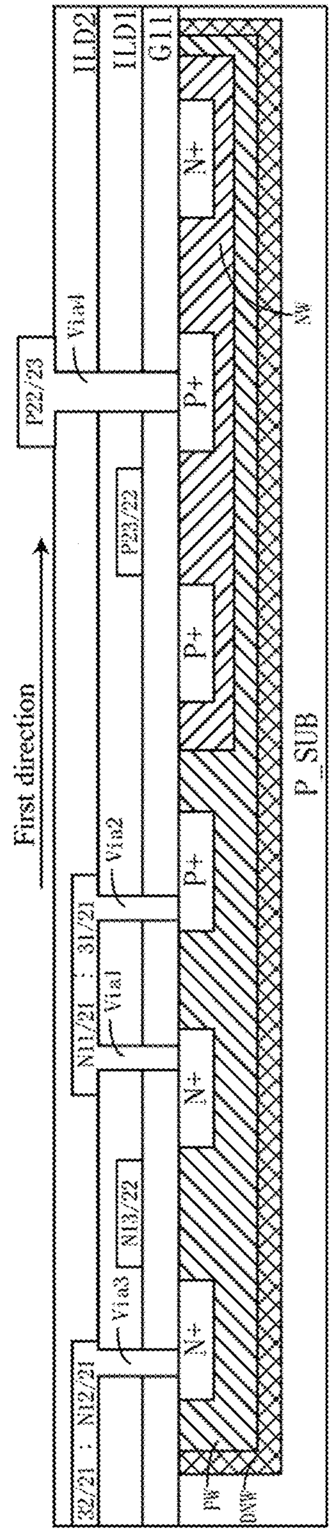
FIG. 4 is a schematic sectional diagram of another display substrate according to some embodiments of the present disclosure.

In a first aspect, some embodiments of the present disclosure provide a display substrate. FIG. 3 is a schematic sectional diagram of a display substrate according to some embodiments of the present disclosure, and FIG. 4 is a schematic sectional diagram of another display substrate according to some embodiments of the present disclosure. As shown in FIGS. 3 and 4, the display substrate includes a silicon-based substrate P_SUB and a plurality of pixel units 1 arranged on the silicon-based substrate P_SUB. The pixel unit 1 includes a pixel drive circuit and a light-emitting component D. The pixel drive circuit includes a first thin film transistor N1, a second thin film transistor P1 and a third thin film transistor P2 arranged on the silicon-based substrate P_SUB. The first thin film transistor N1 includes a first source N11, a first drain N12, a first gate N13 and a first active layer. The second thin film transistor P1 includes a second active layer. The third thin film transistor P2 includes a third active layer. The silicon-based substrate P_SUB includes a first trap NW and a second trap PW arranged in a first direction. A first deep trap DNW is also included between the silicon-based substrate P_SUB and the second trap PW. The first deep trap DNW is arranged around the second trap PW. The second trap PW is provided with the first active layer. The first trap NW is provided with the second active layer and the third active layer.

It should be noted that an active layer of a P-type transistor needs to be made in an N-trap, and an active layer of an N-type transistor needs to be made in a P-trap. In the embodiments of the present disclosure, the first thin film transistor N1 is an N-type thin film transistor, and the second thin film transistor P1 and the third thin film transistor P2 are P-type thin film transistors. Therefore, according to the embodiments of the present disclosure, the first trap NW is an N-trap, the second trap PW is a P-trap, and the first deep trap DNW is a deep N-trap. The first trap NW is an N-trap made by doping of a low-concentration N-type material; the second trap PW is a P-trap made by doping of a low-concentration P-type material; and the first deep trap DNW is a deep N-trap made by doping of a low-concentration N-type material. The silicon-based substrate P_SUB is a P-type substrate or an N-type substrate, and in the present disclosure, the silicon-based substrate P_SUB is a P-type substrate. The active layer of the N-type transistor is directly arranged on the P-type substrate, and correspondingly in the present application, the first active layer of the first thin film transistor N1 is directly arranged on the silicon-based substrate P_SUB. However, since the first source N11 of the first thin film transistor N1 needs to be connected to its bulk, i.e., electrically connected to the second trap PW where the first active layer is provided, it is necessary to provide a first deep trap DNW between the second trap PW and the silicon-based substrate for isolation. When a plurality of N-type transistors are manufactured on the same P-type silicon-based substrate P_SUB, connecting the sources of the N-type transistors to the bulk causes mutual impact. Therefore, it is necessary to separately manufacture the N-type transistors in one P-trap and surround them by a deep N-trap to isolate them from the P-type silicon-based substrate P_SUB, so as to prevent noise interference caused by sharing of the bulk.

Further, the silicon-based substrate P_SUB is also provided with a first conductive layer 21. The first conductive layer 21 includes a first source N11 and a first adapter electrode 31. The first source N11 is connected to a source contact region of the first active layer through a first connecting via hole Via1. The first adapter electrode 31 is connected to a second trap contact region of the second trap PW through a second connecting via hole Via2. The first source N11 is electrically connected to the first adapter electrode 31. The first adapter electrode 31 is electrically connected to the second trap PW directly, i.e., a region of a low-concentration doped P-type material, through the second connecting via hole Via2. By connecting the first source N11 of the first thin film transistor N1 used as a driving transistor to the bulk, the bias effect can be completely eliminated, the threshold voltage of the thin film transistor can be prevented from rising, and voltage loss of a data signal of the pixel drive circuit can be reduced, which in turn increases the maximum voltage provided for the anode of the light-emitting component D by the pixel drive circuit, increases the span of the voltage loaded onto the anode, improves the maximum brightness of the light-emitting component D, expands the range of brightness and increases the display contrast.

In some examples, the third active layer and the second active layer are disposed in the same first trap NW. In the embodiments of the present disclosure, the second thin film transistor P1 and the third thin film transistor P2 are both P-type transistors, and there is no need to electrically connect their sources to the bulk during manufacture. Therefore, the second active layer of the second thin film transistor P1 and the third active layer of the third thin film transistor P2 are arranged in the same first trap NW.

In some examples, two first traps NW are arranged on the silicon-based substrate P_SUB in a first direction; the third active layer and the second active layer are arranged in different first traps NW; the second trap PW surrounds the first trap NW where the third active layer is provided; and the first deep trap DNW surrounds the second trap PW. In case of a high supply voltage input into the pixel drive circuit, for example, when a voltage of 8 V is input into the pixel drive circuit, the N-type transistor and the P-type transistor which are adjacently and separately arranged on the silicon-based substrate P_SUB may produce coupling noise. Therefore, the active layer of the second thin film transistor P1 and the active layer of the third thin film transistor P2 are respectively arranged in different first traps NW, one first trap NW and one second trap PW are arranged in the first deep trap DNW, and the first trap NW in the first deep trap DNW is provided with the third active layer. In order to separate the first trap NW and the first deep trap DNW which are both N-type material doped regions from each other, the second trap PW is made around the first trap NW and the first deep trap DNW is made around the second trap PW.

Further, it is necessary to input analog voltages into the silicon-based substrate P_SUB, the first deep trap DNW and the first trap NW. The first deep trap DNW and the first trap NW are connected to the same potential, which may be an analog voltage input into the pixel drive circuit from the outside. The potential in a P-type doped region needs to be lower than that in an N-doped region. Therefore, the silicon-based substrate P_SUB needs to be connected to a lower potential than the first deep trap DNW. For example, an analog voltage of −8 V needs to be input into the silicon-based substrate P_SUB when an external input voltage is 8 V. Similarly, when the external input voltage is 6 V, an analog voltage of −6 V needs to be input into the silicon-based substrate P_SUB; and a reference ground is also connected to the silicon-based substrate P_SUB.

Figure 5:
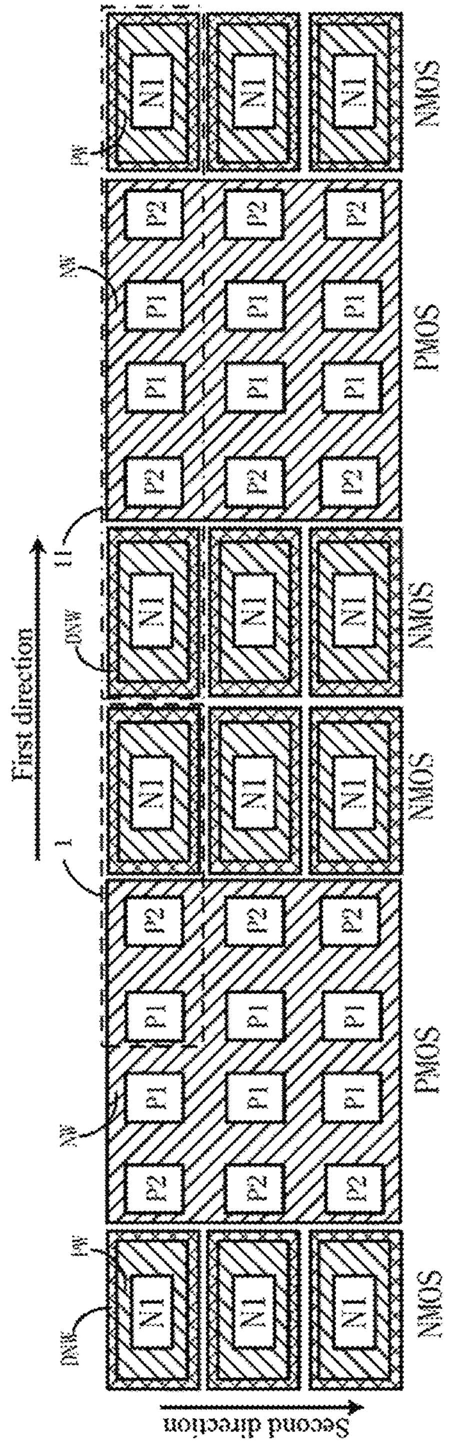
FIG. 5 is a schematic diagram showing arrangement of transistors according to some embodiments of the present disclosure.

In some examples, FIG. 5 is a schematic diagram showing arrangement of transistors according to some embodiments of the present disclosure. As shown in FIG. 5, the display substrate further includes a plurality of repeating units 11 arranged on the silicon-based substrate P_SUB in an array. The repeating unit 11 includes two pixel units 1 arranged in a first direction. The repeating unit 11 is provided with two second traps PW arranged on the silicon-based substrate P_SUB in the first direction and one first trap NW sandwiched between the two second traps PW. A first deep trap DNW is arranged between the second trap PW and the silicon-based substrate P_SUB. The first deep trap DNW is arranged around one of the second traps PW. In the first direction, two second active layers are sandwiched between two third active layers in the first trap NW. In order to improve the PPI of the display substrate, the first thin film transistors N1 are arranged together, and the second thin film transistor P1 and the third thin film transistor P2 are arranged together. In the first direction, the second traps PW around which the first deep trap DNW is arranged are arranged on two sides of the repeating unit 11, the first traps NW are arranged in the middle, and the second traps PW of the adjacent repeating units 11 are arranged adjacently. Therefore, on the display substrate, the first thin film transistor N1, which is an N-type transistor, is arranged in a centralized manner, the active layers of the second thin film transistor P1 and the third thin film transistor P2, which are both P-type transistors, may be made in one first trap NW that is an N-trap. In this way, some N-type transistors and some P-type transistors are arranged in a centralized manner, and a plurality of regions where the N-type transistors and the P-type transistors are arranged are arranged alternately on the display substrate. By this method, the arrangement of the transistors on the silicon-based substrate P_SUB is optimized, and the pixel units 1 are arranged on the display substrate more reasonably.

Further, the repeating units 11 arranged in a second direction share the first trap NW. In the repeating unit 11 arranged in the second direction, the second active layer and the third active layer of the second thin film transistor P1 and the third thin film transistor P2 which are P-type transistors are arranged in the same first trap NW, which further optimizes the arrangement of the transistors of the pixel drive circuit, and also realizes a more reasonable arrangement of the pixel units 1 on the display substrate. The transistors in the pixel drive circuit of the pixel unit 1 are arranged in the above manner, so that the pixel unit 1 may have a pixel spacing of 6.3 μm, the dimension of the first electrode of the light-emitting component D connected to the pixel drive circuit is 4.2 μm×3.15 μm, and the area of the first electrode is about 13.23 square microns, which improves the PPI of the display substrate.

Figure 6:
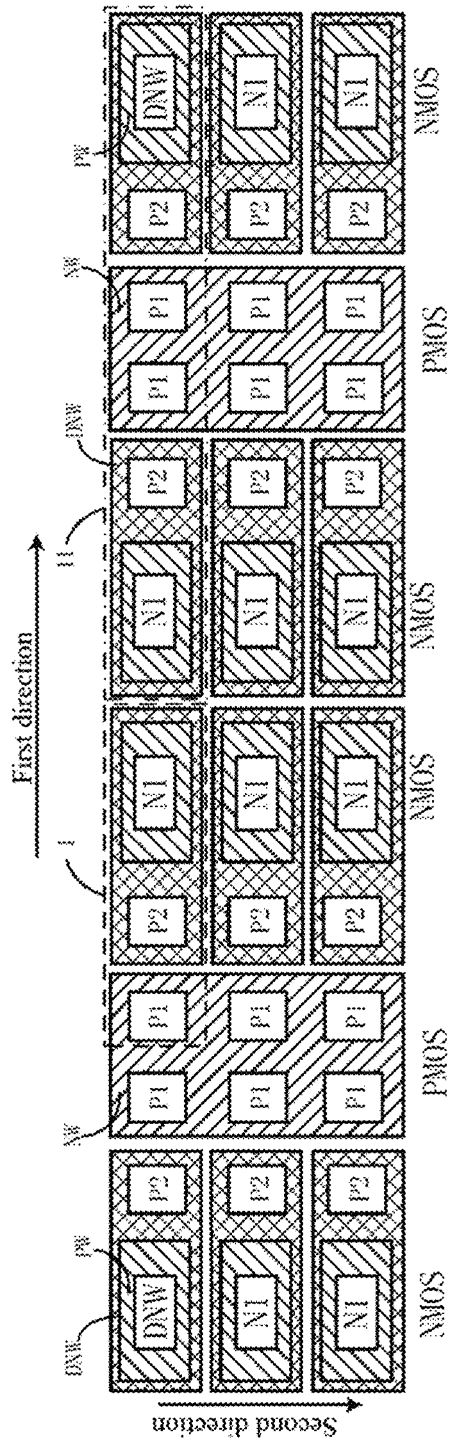
FIG. 6 is schematic diagram showing another arrangement of the transistors according to some embodiments of the present disclosure.

In some examples, FIG. 6 is a schematic diagram showing another arrangement of transistors according to some embodiments of the present disclosure. As shown in FIG. 6, the display substrate further includes a plurality of repeating units 11 arranged on the silicon-based substrate in an array. The repeating unit 11 includes two pixel units 1 arranged side by side in a first direction. The repeating unit 11 is provided with two second traps PW arranged on the silicon-based substrate P_SUB in the first direction and three first traps NW sandwiched between the two second traps PW. The third active layer is arranged in the first trap NW near the second trap PW. The first trap NW disposed in the middle is provided with two second active layers in the first direction. The second trap PW surrounds the first trap NW where the third active layer is provided. The first deep trap DNW is arranged around one of the second traps PW. In the first direction, one first trap NW is sandwiched between two first deep traps DNW. In case of a high supply voltage input into the pixel drive circuit, for example, when a voltage of 8 V is input into the pixel drive circuit, the N-type transistor and the P-type transistor which are adjacently and separately arranged on the silicon-based substrate P_SUB may produce coupling noise. Therefore, the active layer of the second thin film transistor P1 and the active layer of the third thin film transistor P2 are respectively arranged in different first traps NW, one first trap NW and one second trap PW are arranged in the first deep trap DNW, and the first trap NW in the first deep trap DNW is provided with the third active layer. In order to separate the first trap NW and the first deep trap DNW which are both N-type material doped regions from each other, the second trap PW is made around the first trap NW and the first deep trap DNW is made around the second trap PW. In order to improve the PPI of the display substrate, the first thin film transistors N1 are arranged adjacently, and the second thin film transistor P1 and the third thin film transistor P2 are arranged adjacently. In the first direction, the first deep traps DNW around which the second trap PW is arranged are arranged on two sides of the repeating unit 11. The second trap PW also surrounds one of the first traps NW where the third active layer is provided. The first trap NW sandwiched between the two first deep traps DNW is provided with two second active layers in the first direction. The second traps PW of the adjacent repeating units 11 are arranged adjacently. Therefore, on the display substrate, the first thin film transistor N1, which is an N-type transistor, is arranged in a centralized manner, the active layers of the plurality of second thin film transistors P1, which are all P-type transistors, may be made in one first trap NW that is an N-trap. In this way, some N-type transistors and some P-type transistors are arranged in a centralized manner, and a plurality of regions where the N-type transistors and the P-type transistors are arranged are arranged alternately on the display substrate. By this method, the arrangement of the transistors on the silicon-based substrate P_SUB is optimized, and the pixel units 1 are arranged on the display substrate more reasonably.

In some examples, the repeating units 11 arranged in a second direction share the first trap NW disposed in the middle and sandwiched between the two first deep traps DNW. In the repeating unit 11 arranged in the second direction, the second active layers of the second thin film transistors P1 which are P-type transistors are arranged in the same first trap NW, which further optimizes the arrangement of the transistors of the pixel drive circuit, and also realizes a more reasonable arrangement of the pixel units 1 on the display substrate. The transistors in the pixel drive circuit of the pixel unit 1 are arranged in the above manner, so that the pixel unit 1 may have a pixel spacing of 6.3 μm, the dimension of the first electrode of the light-emitting component D connected to the pixel drive circuit is 4.2 μm×3.15 μm, and the area of the first electrode is about 13.23 square microns, which improves the PPI of the display substrate.

In some examples, the first conductive layer 21 further includes a first drain N12; the first drain N12 is electrically connected to a drain contact region of the first active layer through a third connecting via hole Via3; and the first drains N12 of the adjacent first thin film transistors N1 are electrically connected at the first conductive layer 21. The first thin film transistors N1 of the adjacent repeating units 11 are adjacent to each other, so that the drains of the adjacent first thin film transistors N1 for driving may be connected to the same power signal line during manufacture.

In some examples, the first conductive layer 21 further includes a first conductive pattern 32; the first conductive pattern 32 at least partially includes a first power signal line; and the first drain N12 is electrically connected to the first conductive pattern 32. The first conductive pattern 32 is formed on the first conductive layer 21, a part of the first conductive pattern 32 is a first power signal line for providing a driving voltage to the pixel drive circuit, and the two adjacent first drains N12 are connected to the same first power signal line.

In some examples, the display substrate further includes a third conductive layer 23 distal from a side of the first conductive layer 21; the third thin film transistor P2 includes a third drain P22; the third drain P22 is arranged on the third conductive layer 23; and the third drain P22 is electrically connected to a drain contact region of the third active layer through a fourth connecting via hole Via4. The light-emitting component D includes a first electrode, a light-emitting layer and a second electrode. The first electrode is electrically connected to the third drain P22. The third drain P22 of the third thin film transistor P2 is used as an output terminal, so that the third drain P22 is connected to the first electrode of the light-emitting component D to drive the light-emitting component D to emit light. According to the embodiments of the present disclosure, the laminated structure is merely an exemplary structure, and can be adjusted by those skilled in the art according to actual needs, for example, adding other conductive layers, insulating layers or functional layers (not shown in the figure) to the third conductive layer 23 and the silicon-based substrate P_SUB.

In some examples, as shown in FIGS. 3 and 4, the display substrate further includes: a second conductive layer 22 disposed between the silicon-based substrate P_SUB and the first conductive layer 21 and including a first gate N13, a second gate of the second thin film transistor P1, and a third gate P23 of the third thin film transistor P2; a first gate insulating layer GI1 disposed between the silicon-based substrate P_SUB and the second conductive layer 22; a first interlayer insulating layer ILD1 disposed between the first conductive layer 21 and the second conductive layer 22; and a second interlayer insulating layer ILD2 disposed on the side of the first conductive layer 21 distal from the silicon-based substrate P_SUB. The first connecting via hole Via1, the second connecting via hole Via2 and the third connecting via hole Via3 run through the first interlayer insulating layer ILD1 and the first gate insulating layer GI1. The fourth connecting via hole Via4 runs through the second interlayer insulating layer ILD2, the first interlayer insulating layer ILD1 and the first gate insulating layer GI1. According to the embodiments of the present disclosure, the laminated structure is merely an exemplary structure, and can be adjusted by those skilled in the art according to actual needs, for example, adding other conductive layers, insulating layers or functional layers (not shown in the figure) to the first conductive layer 21 and the silicon-based substrate P_SUB.

In some examples, the display substrate further includes a first encapsulation layer, a color film layer, and a second encapsulation layer sequentially disposed away from the second electrode of the light-emitting component D. The first electrode of the light-emitting component D is generally made of ITO, which has high transmittance and high work function. The light-emitting layer of the light-emitting component D is usually made of an organic material, and by using the characteristics of luminescence of the organic material, holes and electrons are excited under the action of voltage or current to form excitons, so as to realize light emission. The second electrode is arranged on the light-emitting layer, and the second electrode is of a transparent structure and is disposed under the first encapsulation layer, and may be made of one or more alloy materials of Mg/Ag. The side of the first encapsulation layer distal from the second electrode is also provided with the color film layer and the second encapsulation layer. The color film layer is arranged between the second encapsulation layer and the first encapsulation layer, and is arranged corresponding to the light-emitting layer, thus realizing color display of emitted light. The second encapsulation layer is used in combination with the first encapsulation layer to realize effective encapsulation of the OLED device and effective blocking of water vapor and oxygen, thereby achieving the purposes of protecting the device and prolonging the service life of the device. The color film layer and the light-emitting layer work together. The second encapsulation layer is arranged above the color film layer to play the role of protecting the color film layer. The first encapsulation layer and the second encapsulation layer are made from one or more of organic materials and inorganic materials with excellent sealing characteristics, such as silicon oxide and silicon nitride, to protect the structure of the OLED device and achieve a better sealing effect.

It should be noted that the materials of the first electrode, the light-emitting layer and the second electrode of the light-emitting component D or the materials of the first encapsulation layer, the color film layer and the second encapsulation layer of the display substrate are not further limited in the present disclosure, and those skilled in the art can choose appropriate materials according to actual needs.

In a second aspect, some embodiments of the present disclosure further provide a display module, including any one of the display substrates described above.

In some examples, the display module further includes a flexible printed circuit board and cover glass. The cover glass can effectively encapsulate OLED devices and effectively block water vapor and oxygen so as to protect the device and prolong the service life of the device. The cover glass is made of a transparent material, for example, mother glass with high transmittance. The flexible printed circuit board and the display substrate are electrically connected to realize transmission of an external signals and transmit an external voltage to a pixel drive circuit, so as to provide a driving voltage to the pixel drive circuit.

In a third aspect, some embodiments of the present disclosure further include a display device, including any one of the display modules described above. The display device may be a small display device such as a mobile phone and a watch, or a large display device such as a TV and a computer.

It can be understood that the above embodiments are merely exemplary embodiments for explaining the principles of the present disclosure, but the present disclosure is not limited thereto. Those of ordinary skill in the art can make various variations and improvements without departing from the spirit and essence of the present disclosure, and these variations and improvements shall be included into the scope of protection of the present disclosure.

The invention claimed is:

1. A display substrate, comprising a silicon-based substrate and a plurality of pixel units arranged on the silicon-based substrate, wherein each pixel unit comprises a pixel drive circuit and a light-emitting component;

the pixel drive circuit comprises a first thin film transistor, a second thin film transistor and a third thin film transistor arranged on the silicon-based substrate, wherein the first thin film transistor comprises a first source, a first drain, a first gate and a first active layer, the second thin film transistor comprises a second active layer, and the third thin film transistor comprises a third active layer;

the silicon-based substrate is provided with a first trap and a second trap arranged in a first direction, a first deep trap is further provided between the silicon-based substrate and the second trap, and the first deep trap is arranged around the second trap;

the second trap is provided with the first active layer, and the first trap is provided with the second active layer and the third active layer; and the silicon-based substrate is also provided with a first conductive layer, the first conductive layer comprises the first source and a first adapter electrode, the first source is connected to a source contact region of the first active layer through a first connecting via hole, the first adapter electrode is connected to a second trap contact region of the second trap through a second connecting via hole, and the first source is electrically connected to the first adapter electrode.

2. The display substrate according to claim 1, wherein the third active layer and the second active layer are provided in the same first trap.

3. The display substrate according to claim 1, wherein the silicon-based substrate is provided with two first traps and one second trap in the first direction; the third active layer and the second active layer are provided in the different first traps; the second trap surrounds the first trap where the third active layer is provided; and the first deep trap surrounds the second trap.

4. The display substrate according to claim 1, further comprising a plurality of repeating units arranged on the silicon-based substrate in an array, wherein each repeating unit comprises two pixel units arranged side by side in the first direction;

the repeating unit is provided with two second traps arranged on the silicon-based substrate in the first direction and one first trap sandwiched between the two second traps, the first deep trap is arranged between the second trap and the silicon-based substrate, and the first deep trap is arranged around one of the second traps; and in the first direction, the two second active layers are sandwiched between the two third active layers in the first trap.

5. The display substrate according to claim 4, wherein the repeating units arranged in a second direction share the first trap.

6. The display substrate according to claim 1, further comprising a plurality of repeating units arranged on the silicon-based substrate in an array, wherein the repeating unit comprises two pixel units arranged side by side in the first direction;

the repeating unit is provided with two second traps arranged on the silicon-based substrate in the first direction and three first traps sandwiched between the two second traps;

the third active layer is arranged in the first trap near the second trap, and in the first trap disposed in the middle, two second active layers are arranged in the first direction;

the second trap surrounds the first trap where the third active layer is provided, and the first deep trap is arranged around one of the second traps; and in the first direction, one of the first traps is sandwiched between the two first deep traps.

7. The display substrate according to claim 6, wherein the repeating units arranged in a second direction share the first trap disposed in the middle.

8. The display substrate according to claim 1, wherein the first conductive layer further comprises the first drain; the first drain is electrically connected to a drain contact region of the first active layer through a third connecting via hole; and the first drains of the adjacent first thin film transistors are electrically connected at the first conductive layer.

9. The display substrate according to claim 1, wherein the first conductive layer further comprises a first conductive pattern; the first conductive pattern at least partially comprises a first power signal line; and the first drain is electrically connected to the first conductive pattern.

10. The display substrate according to claim 1, further comprising a third conductive layer distal from a side of the first conductive layer, wherein the third thin film transistor comprises a third drain; the third drain is arranged on the third conductive layer; the third drain is electrically connected to a drain contact region of the third active layer through a fourth connecting via hole; the light-emitting component comprises a first electrode, a light-emitting layer and a second electrode; and the first electrode is electrically connected to the third drain.

11. The display substrate according to claim 1, further comprising:

a second conductive layer disposed between the silicon-based substrate and the first conductive layer and comprising the first gate, a second gate of the second thin film transistor and a third gate of the third thin film transistor;

a first gate insulating layer disposed between the silicon-based substrate and the second conductive layer;

a first interlayer insulating layer disposed between the first conductive layer and the second conductive layer; and a second interlayer insulating layer disposed on a side of the first conductive layer distal from the silicon-based substrate; wherein the first connecting via hole, the second connecting via hole and the third connecting via hole run through the first interlayer insulating layer and the first gate insulating layer, and the fourth connecting via hole runs through the second interlayer insulating layer, the first interlayer insulating layer and the first gate insulating layer.

12. The display substrate according to claim 10, further comprising a first encapsulation layer, a color film layer and a second encapsulation layer sequentially arranged distal from the second electrode of the light-emitting component.

13. A display module, comprising a display substrate, wherein the display substrate comprises a silicon-based substrate and a plurality of pixel units arranged on the silicon-based substrate, wherein each pixel unit comprises a pixel drive circuit and a light-emitting component;

the pixel drive circuit comprises a first thin film transistor, a second thin film transistor and a third thin film transistor arranged on the silicon-based substrate, wherein the first thin film transistor comprises a first source, a first drain, a first gate and a first active layer, the second thin film transistor comprises a second active layer, and the third thin film transistor comprises a third active layer;

the silicon-based substrate is provided with a first trap and a second trap arranged in a first direction, a first deep trap is further provided between the silicon-based substrate and the second trap, and the first deep trap is arranged around the second trap;

the second trap is provided with the first active layer, and the first trap is provided with the second active layer and the third active layer; and the silicon-based substrate is also provided with a first conductive layer, the first conductive layer comprises the first source and a first adapter electrode, the first source is connected to a source contact region of the first active layer through a first connecting via hole, the first adapter electrode is connected to a second trap contact region of the second trap through a second connecting via hole, and the first source is electrically connected to the first adapter electrode.

14. The display module according to claim 13, further comprising a flexible printed circuit board and cover glass.

15. A display device, comprising a display module comprising a display substrate, wherein the display substrate comprises a silicon-based substrate and a plurality of pixel units arranged on the silicon-based substrate, wherein each pixel unit comprises a pixel drive circuit and a light-emitting component;

the pixel drive circuit comprises a first thin film transistor, a second thin film transistor and a third thin film transistor arranged on the silicon-based substrate, wherein the first thin film transistor comprises a first source, a first drain, a first gate and a first active layer, the second thin film transistor comprises a second active layer, and the third thin film transistor comprises a third active layer;

the silicon-based substrate is provided with a first trap and a second trap arranged in a first direction, a first deep trap is further provided between the silicon-based substrate and the second trap, and the first deep trap is arranged around the second trap;

the second trap is provided with the first active layer, and the first trap is provided with the second active layer and the third active layer; and the silicon-based substrate is also provided with a first conductive layer, the first conductive layer comprises the first source and a first adapter electrode, the first source is connected to a source contact region of the first active layer through a first connecting via hole, the first adapter electrode is connected to a second trap contact region of the second trap through a second connecting via hole, and the first source is electrically connected to the first adapter electrode.

16. The display device according to claim 15, wherein the third active layer and the second active layer are provided in the same first trap.

17. The display device according to claim 15, wherein the silicon-based substrate is provided with two first traps and one second trap in the first direction; the third active layer and the second active layer are provided in the different first traps; the second trap surrounds the first trap where the third active layer is provided; and the first deep trap surrounds the second trap.

18. The display device according to claim 15, wherein the display substrate further comprises a plurality of repeating units arranged on the silicon-based substrate in an array, wherein each repeating unit comprises two pixel units arranged side by side in the first direction;

the repeating unit is provided with two second traps arranged on the silicon-based substrate in the first direction and one first trap sandwiched between the two second traps, the first deep trap is arranged between the second trap and the silicon-based substrate, and the first deep trap is arranged around one of the second traps; and in the first direction, the two second active layers are sandwiched between the two third active layers in the first trap.

19. The display device according to claim 15, wherein the display substrate further comprises a plurality of repeating units arranged on the silicon-based substrate in an array, wherein the repeating unit comprises two pixel units arranged side by side in the first direction;

the repeating unit is provided with two second traps arranged on the silicon-based substrate in the first direction and three first traps sandwiched between the two second traps;

the third active layer is arranged in the first trap near the second trap, and in the first trap disposed in the middle, two second active layers are arranged in the first direction;

the second trap surrounds the first trap where the third active layer is provided, and the first deep trap is arranged around one of the second traps; and in the first direction, one of the first traps is sandwiched between the two first deep traps.

20. The display device according to claim 15, wherein the first conductive layer further comprises the first drain; the first drain is electrically connected to a drain contact region of the first active layer through a third connecting via hole; and the first drains of the adjacent first thin film transistors are electrically connected at the first conductive layer.

* * * * *